United States Patent
Götz et al.

(10) Patent No.: US 6,187,877 B1
(45) Date of Patent: *Feb. 13, 2001

(54) PROCESS FOR PRODUCING A POLYAMIDE BASED ON A DICARBOXYLIC ACID AND A DIAMINE

(75) Inventors: Walter Götz; Jürgen Hofmann, both of Ludwigshafen; Michael Kopietz, Grünstadt; Helmut Horle, Lampertheim, all of (DE)

(73) Assignee: BASF Aktiengesellschaft, Ludwigshafen (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/930,865

(22) PCT Filed: Mar. 28, 1996

(86) PCT No.: PCT/EP96/01365

§ 371 Date: Oct. 7, 1997

§ 102(e) Date: Oct. 7, 1997

(87) PCT Pub. No.: WO96/33234

PCT Pub. Date: Oct. 24, 1996

(30) Foreign Application Priority Data

Apr. 15, 1995 (DE) ................................. 195 14 145

(51) Int. Cl.$^7$ ......................... C08G 85/00; C08G 69/30; C08G 69/28; C08F 2/36
(52) U.S. Cl. ..................... 526/65; 526/67; 528/332; 528/335
(58) Field of Search ................... 528/335, 332; 526/65, 67

(56) References Cited

U.S. PATENT DOCUMENTS

| | | |
|---|---|---|
| 3,657,195 * | 4/1972 | Doerfel et al. ................ 260/785 C |
| 3,900,450 | 8/1975 | Jaswal et al. . |
| 4,019,866 | 4/1977 | Jaswal et al. . |
| 4,540,772 | 9/1985 | Pipper et al. . |
| 5,663,284 * | 9/1997 | Kominami et al. ................ 528/335 |

FOREIGN PATENT DOCUMENTS

| | | |
|---|---|---|
| 929 151 | 6/1955 | (DE) . |
| 1 720 349 | 6/1971 | (DE) . |
| 2 410 474 | 9/1974 | (DE) . |
| 123 377 | 10/1984 | (EP) . |
| 129 195 | 12/1984 | (EP) . |
| 129 196 | 12/1984 | (EP) . |
| 2 220 554 | 10/1974 | (FR) . |
| 1 453 485 | 10/1976 | (GB) . |

* cited by examiner

Primary Examiner—Fred Zitomer
(74) Attorney, Agent, or Firm—Keil & Weinkauf

(57) ABSTRACT

A polymer based on a dicarboxylic acid and a diamine is prepared by polycondensation in an extruder, by (a) heating a mixture of a dicarboxylic acid having from 4 to 12 carbon atoms and a diamine having from 4 to 12 carbon atoms, which mixture is solid at room temperature and has a residual moisture content of less than 5% by weight, to a temperature in the range from 150 to 400° C. under autogenous pressure in a contrarotating twin-screw extruder to give a product A, (b) feeding the product A to a corotating twin-screw extruder, with the product A being exposed to a temperature in the range from 150 to 400° C. and residual water present and also water from the polycondensation being removed through the degassing openings, to give a product B, with the proviso that the corotating twin-screw extruder has at least two segments having different pressures.

5 Claims, No Drawings

PROCESS FOR PRODUCING A POLYAMIDE BASED ON A DICARBOXYLIC ACID AND A DIAMINE

The present invention relates to an improved process for preparing a polymer based on a dicarboxylic acid and a diamine by polycondensation in an extruder.

DE-A 1,720,349 describes the preparation of relatively high molecular weight polyamide-66 having a K value in the range from 69 to 72 by continuous further condensation of low molecular weight polyamide-66 having a K value in the range from 30 to 60 in a corotating screw reactor.

Disadvantages of this process are that the process is only suitable for post-condensation and that the prepolymer used has to be prepared conventionally in stirred reactors or tube reactors.

It is known that in these conventional processes, described for example in DE-A 929 151, DE-A 24 10 474, EP-A 129 195 and EP-A 129 196, aqueous solutions of the monomer compounds are used. These can be conveyed without problems as single-phase liquids through pipes and pumps. A disadvantage is that large amounts of water have to be removed with high consumption of energy before the post-condensation to higher molecular weight polymers can be carried out. In addition, conventional reactors are designed with large dimensions so as to be able to accommodate the large volume of water vapor. This results in poor space-time yields. Furthermore, the vapor to be removed is generally contaminated with monomers so that it has to be subjected to complicated purification and the monomers have to be recycled. In addition, large reactors are very unfavorable when changing products because of the large intermediate runs.

EP-A 123 377 describes a polycondensation process for preparing polyamides by feeding a heated solution of a salt or a prepolymer or a mixture thereof into a vaporization reactor to form an aerosol mist, with this vaporization reactor having a high heat flow and the polymer obtained being held therein for up to 20 seconds. However, this procedure is economically unfavorable because of, inter alia, the technical expense of generating pressures and high temperatures, the control units required and the handling of the aerosol mist. In addition, the process is, because of the high temperatures used, preferably suitable for preparing high-temaLoerature-resistant polyamides based on aromatic dicarboxylic acids and diamines.

It is an object of the present invention to provide an improved process which does not have the specified disadvantages. In particular, there is to be provided a process which starts out from solid monomers or monomer mixtures containing little water and which leads to polymers in which the difference between carboxyl end groups and amino end groups is not greater than 80, and which can be rapidly heat-treated to give polymers having high molecular weights.

We have found that this object is achieved by a process for preparing a polymer based on a dicarboxylic acid and a diamine by polycondensation in an extruder, by (a) heating a mixture of a dicarboxylic acid having from 4 to 12 carbon atoms and a diamine having from 4 to 12 carbon atoms, which mixture is solid at room temperature and has a residual moisture content of less than 5% by weight, to a temperature in the range from 150 to 400° C. under autogenous pressure in a contrarotating twin-screw extruder to give a product A, (b) feeding the product A to a corotating twin-screw extruder, with the product A being exposed to a temperature in the range from 150 to 400° C. and residual water present and also water from the polycondensation being removed through the degassing openings, to give a product B, with the proviso that the corotating twin-screw extruder has at least two segments having different pressures.

The starting materials used according to the invention are mixtures of a dicarboxylic acid having from 4 to 12 carbon atoms and a diamine having from 4 to 12 carbon atoms, preferably equimolar mixtures having an excess of one component of less than 5 mol %, preferably less than 2 mol %, particularly preferably less than 1 mol %.

Dicarboxylic acids used are preferably adipic acid, pimelic acid, suberic acid, azelaic acid and sebacic acid and also terephthalic acid, isophthalic acid, 5-sulfoisophthalic acid or mixtures of the specified dicarboxylic acids, particularly preferably adipic acid.

Diamines used are preferably tetramethylenediamine, hexamethylenediamine, octamethylenediamine, decamethylenediamine and dodecamethylenediamine and also m-xylylenediamine, bis(4-aminophenyl)methane, 2,2-bis(4-aminophenyl)propane and bis(4-aminocyclohexyl)methane, or mixtures of the specified diamines, particularly preferably hexamethylenediamine.

In a preferred embodiment, hexamethylenediammonium adipate ("AH salt") is used.

According to the invention, the residual moisture content of the mixture used is less than 5, preferably less than 2, particularly preferably less than 1.5, % by weight.

According to the invention, a monomer mixture as above is fed to a contrarotating twin-screw extruder in which the monomer mixture is melted. The screws of the contrarotating twin-screw extruder preferably have a length: diameter ratio of from 12 to 50, particularly preferably from 18 to 36. In a particularly preferred embodiment, the screw diameter is selected in the range from 25 to 250 mm, in particular from 40 to 130 mm.

It is further preferred that the contrarotating twin-screw extruder is divided into segments with separately adjustable temperatures, of which the first segment having a length of from 4 to 8 D is preferably set to a temperature from 20 to 180° C., particularly preferably from 25 to 100° C., below the melting point of the polyamide formed. For the subsequent segments, the temperatures selected are preferably from 5° C. below and 50° C. above, in particular from 5 to 50° C. above, the melting point of the polyamide formed. In a particularly preferred embodiment for preparing polyamide 66, the temperature range for the subsequent segments is from 250 to 300° C., in particular from 260 to 300° C., more particularly from 260 to 275° C.

Furthermore, the rotation rate selected is usually in the range from 50 to 250 rpm, preferably from 100 to 200 rpm.

It is essential to the invention that in the contrarotating twin-screw extruder there prevails an autogenous pressure which is determined by the selected temperature and the volatility of the components (monomers, water of reaction and any residual moisture in the monomer mixture). This can be achieved by selecting the spacing between extruder screw and internal wall of the barrel so that the relative gap $G=(D-D_B)/D$, where $D=2\times$radius of the extruder screw at the flight and $D_B=2\times$internal radius of the barrel, is usually less than 0.02, preferably in the range from 0.015 to 0.0001, particularly preferably in the range from 0.006 to 0.001. In a particularly preferred embodiment having a D of 34 mm, the spacing $(D-D_B)$ is selected so as to be <0.5 mm, preferably <0.2 mm, which corresponds to values of G<0.015 preferably G<0.006.

Furthermore, the rotation rate selected is usually in the range from 50 to 250 rpm, preferably from 100 to 200 rpm.

The residence time in the contrarotating extruder is usually selected so as to be in the range from 0.5 to 8 min, preferably from 1 to 4 min.

According to the invention, the (molten) product A and the associated gases (water vapor and monomer vapors) from the contrarotating twin-screw extruder are fed to a corotating twin screw extruder. The polycondensation is advantageously carried out at liquid-phase temperatures in the range from 150 to 400° C., preferably from 180 to 300° C., but above the melting point of the polymer to be prepared. For example, in the preparation of polyamide-66, the temperature is selected so as to be in the range from 255 to 300° C., particularly preferably from 260 to 285° C.

The corotating (based on the direction of rotation of the extruder screws) twin-screw extruder usually has a length: diameter ratio (L:D) in the range from 12 to 50, preferably from 18 to 36. In a particularly preferred embodiment, the screw diameter is selected so as to be in the range from 25 to 250 mm, in particular from 40 to 130 mm.

Furthermore, the corotating twin-screw extruder is preferably divided into segments having separately adjustable temperatures.

It is essential to the invention that the corotating twin-screw extruder comprises at least 2 segments having different pressures.

In a preferred embodiment, one such segment encompasses the input of the melt from stage a in which an autogenous pressure should preferably have prevailed. At least one further segment, preferably from 2 to 4 segments, contains at least one degassing opening so that the pressure prevailing there is lower than that in the segment in which the melt from stage a is introduced.

The segments usually have a length of at least 4 D, preferably from 6 to 18 D, particularly preferably from 6 to 12 D.

Furthermore, the pressure over a degassing opening, ie. on the exterior of the extruder, is generally selected so as to be in the range from 1 MPa to 1 kPa, preferably from 500 kPa to 50 kPa.

In a further preferred embodiment, the extruder used in stage b has a first segment in which autogenous pressure prevails and from two to four further segments each containing degassing openings, with the pressure over the degassing openings decreasing stepwise from the second to the last segment. Particular preference is given here to arrangements having three segments, where the pressure over the degassing opening of the second segment is selected so as to be in the range from 1 mPa to 100 kPa, preferably from 50 to 10 kPa. Particularly preferred are furthermore arrangements having four segments where the pressure over the degassing opening of the second segment is selected so as to be in the range from 1 MPa to 100 kPa, preferably from 500 to 100 kPa, the pressure over the degassing opening of the third segment is selected so as to be in the range from 150 to 20 kPa, preferably from 50 to 10 kPa, and the pressure over the degassing opening of the fourth segment is selected so as to be in the range from 50 to 1 kPa, preferably from 20 to 5 kPa, with the proviso that the pressure over the degassing openings decreases from segment to segment by at least 20%.

To obtain segments having different pressures, it has been found to be advantageous according to previous observations to divide the screws of the corotating twin-screw extruder into zones having different screw pitches. Besides the screw pitches acting in the transport direction, it is particularly advantageous to use at least one zone having a length of from 0.33 to 3 D and screw pitches acting in the opposite direction to the transport direction between each of the segments which are to have a different pressure. In a particularly preferred embodiment, the throughput is additionally selected, as a function of the extruder diameter, so as to be sufficiently high for the backward-acting zones to be filled with melt, so that they act as pressure-tight barriers between the segments having different pressures.

In a preferred embodiment, the product A is fed into the (corotating) extruder at a distance of from 3 to 8 D, particularly preferably from 4 to 6 D, from the beginning of the extruder.

To seal the screw running to the drive against atmospheric oxygen, it is possible to use an auxiliary, preferably a polymer obtained from the same monomer units as are present in the monomer mixture. The amount of this auxiliary is usually selected so as to be in the range from 0.5 to 5, preferably from 1 to 3, % by weight, based on the monomer mixture used.

In a further preferred embodiment, the customary additives such as heat and UV stabilizers, nucleating agents and pigments can also be used as auxiliaries.

The gases exiting from the degassing openings (essentially water of reaction in vapor form and entrained polymer constituents and also volatile amines) are preferably collected, rectified using customary distillation equipment and separated into vapor and bottoms. The bottoms, consisting essentially of amines and entrained polymer droplets, are preferably recycled into the first, contrarotating extruder, particularly preferably into the first third of the extruder, viewed from the beginning of the extruder.

Furthermore, the rotation rate is usually selected so as to be in the range from 50 to 250 rpm, preferably from 100 to 200 rpm.

The residence time in the corotating extruder is generally selected so as to be in the range from 0.5 to 8 min, preferably from 1 to 4 min.

The product B of the corotating extruder comprises a polymer having a viscosity number (measured on a 0.5% strength by weight solution in 96% strength by weight sulfuric acid at 25° C.) in the range from 40 to 185 ml/g, particularly preferably from 45 to 155 ml/g, very particularly preferably from 50 to 80 ml/g.

The difference carboxyl end groups-amino end groups is particularly preferably selected so as to be in the range from 50 to −10, preferably from 30 to 10.

The polymer obtained in step (b) is generally extruded into strands, solidified in a water bath and subsequently granulated.

In a further step, the polymer obtained in (b), preferably as granules, can be subjected to a solid-state condensation, preferably if the viscosity number is less than 140 ml/g, particularly preferably if it is less than 120 ml/g. The post-condensation is preferably carried out at a temperature from 10 to 100° C. below the melting point of the polymer to be prepared. For example, in the post-condensation of the polymer to prepare polyamide-66, a temperature in the range from 160 to 190° C. is selected.

The residence times depend, inter alia, on the desired molecular weight of the polymer and are generally in the range from 2 to 48 hours.

The post-condensation can be carried out batchwise or continuously, preferably in an inert gas atmosphere such as nitrogen.

The desired molecular weight of the post-condensed polymer is generally in a range in which the polymer has a viscosity number in the range from 125 to 500 ml/g, preferably from 135 to 185 ml/g, particularly preferably from 140 to 155 ml/g.

The process of the invention allows the preparation of polymers having high viscosity numbers without requiring the equipment of conventional plants. Furthermore, the present process makes it possible to start out from monomers or monomer mixtures which contain little or no water and lead to polymers having an amino to carboxyl end group ratio of about 1, so that high molecular weights are possible.

EXAMPLES

The determination of the carboxyl end groups was carried out by titration in benzyl alcohol.

Example 1

The viscosity numbers were determined on a 0.5% strength by weight solution in 96% strength by weight sulfuric acid at 25° C.

A contrarotating twin-screw extruder having D=34 mm screw diameter (from Leistritz) and a length of 36 D conveyed centrifuge-moist AH salt (1:1 adduct of adipic acid and diaminohexane, precipitated by cooling a hot, saturated solution, dried by centrifuging to a water content of 1.2% by weight) at the temperatures, rotation rates and throughputs given in the table below.

This extruder conveyed the melt into a corotating twin-screw extruder having D=40 mm screw diameter (ZSK 40 from Werner+Pfleiderer, Stuttgart) and a length of 40 D, with the melt being fed in about 6 D from the beginning of the extruder. From the beginning of the extruder, 3% by weight, based on the amount of AH salt used, of a polyamide 66 prepolymer having a VN (viscosity number) of 59 ml/g, which had been prepared as described in EP 129 195, was conveyed for sealing the screw against atmospheric oxygen. After about 16 D an atmospheric-pressure degassing was provided, connected to a recitification column (standard glass apparatus, 29 mm diameter, 60 cm height, glass column packing 3 mm diameter, 9 theoretical plates). The bottoms thereof were conveyed by a piston pump to the beginning of the Leistritz extruders.

Further along the extruder there was a pressure-tight seal in the form of a 20 mm backing-up element, then a vacuum degassing operated at a residual pressure of 700 mbar at about 25 D and, after a further backing-up element, a second vacuum degassing operated at a residual pressure of 100 mbar after about 31 D. This conveyed the melt further into a degassing zone where, by application of vacuum, defined degassing was carried out with simultaneous heat input.

The respective extruder parameters (temperature, rotation rate, throughput) are given in the table below.

Example 2 (Comparison)

Example 1 was repeated except that no corotating extruder was used.

Example 3 (Comparison)

Example 1 was repeated except that no contrarotating extruder was used. To achieve a longer residence time, a 30 mm extruder (ZSK 30 from Werner+Pfleiderer) containing no backing-up elements was connected upstream of the corotating extruder.

All polymers were heat treated in a glass rotary evaporator for 8 hours at 170° C. under nitrogen. They were subsequently extruded onto a metal sheet, allowed to cool and the cooled product was milled. The viscosity numbers obtained on these end products are likewise shown in the table below.

TABLE

| No. | Through-put [kg/h] | Rotation rate [rpm] | Temperature [° C.] | VN of polymer [ml/g] | AEG in polymer [mmol/kg] | CEG in polymer [mmol/kg] | VN of end product [ml/g] |
| --- | --- | --- | --- | --- | --- | --- | --- |
| 1a | 4 | 150 | 275 | 62 | 85 | 95 | 185 |
| 1b | 8 | 150 | 275 | 60 | 64 | 100 | 190 |
| 1c | 12 | 150 | 275 | 58 | 78 | 94 | 187 |
| 1d | 4 | 250 | 275 | 60 | 55 | 129 | 156 |
| 1e | 8 | 250 | 275 | 44 | 42 | 164 | 144 |
| 1f | 4 | 150 | 285 | 55 | 47 | 155 | 150 |
| 1g | 8 | 150 | 285 | 49 | 40 | 164 | 139 |
| 2a | 4 | 150 | 275 | 22 | 61 | 839 | 26 |
| 2b | 8 | 150 | 275 | 24 | 80 | 524 | 30 |
| 2c | 12 | 150 | 275 | 25 | 71 | 555 | 30 |
| 2d | 4 | 250 | 275 | 28 | 62 | 488 | 30 |
| 2e | 8 | 250 | 275 | 25 | 80 | 601 | 28 |
| 2f | 4 | 150 | 285 | 21 | 155 | 957 | 25 |
| 2g | 8 | 150 | 285 | 19 | 160 | 1020 | 23 |
| 3a | 4 | 150 | 275 | 18 | 171 | 1313 | 20 |
| 3b | 8 | 150 | 275 | 19 | 151 | 1405 | 21 |
| 3c | 12 | 150 | 275 | 15 | 187 | 1365 | 21 |
| 3d | 4 | 250 | 275 | 15 | 187 | 1365 | 21 |
| 3e | 8 | 250 | 275 | 15 | 240 | 1403 | 20 |
| 3f | 4 | 150 | 285 | 10 | 410 | 1767 | 15 |
| 3g | 8 | 150 | 285 | 15 | 314 | 1650 | 20 |

The products from Examples 2 and 3 did not form threads and could not be granulated. A strong amine odor was found when extruding these products.

We claim:
1. A process for preparing a Polyamide polymer based on a dicarboxylic acid and a diamine by polycondensation in an extruder, which comprises
   (a) heating a mixture of a dicarboxylic acid having from 4 to 12 carbon atoms and a diamine having from 4 to 12 carbon atoms, which mixture is solid at room temperature and has a residual moisture content of less than 5% by weight, to a temperature in the range from 150 to 400° C. under autogenous pressure in a contrarotating twin-screw extruder to give a polyamide product A, (b) feeding the polyamide product A to polycondensation in a corotating twin-screw extruder, with the product A being exposed to a temperature in the range from 150 to 400° C. and residual water present and also water from the polycondensation being removed through the degassing openings, to give a polyamide product B, which has a viscosity number (as measured on a 0.5% polymer solution in 96% by weight sulfuric acid at 25° C.) in the range of from 40 to 185 ml/g, with the proviso that the corotating twin-screw extruder has at least two segments having different pressures.

2. A process as claimed in claim 1, wherein the mixture used is hexamethylenediammonium adipate.

3. A process as claimed in claim 1, wherein the product B has a viscosity number in the range from 40 to 155 ml/g.

4. A process as claimed in claim 3, wherein
   (a) a product B having a viscosity number in the range of from 40 to 140 ml/g is prepared and
   (b) this product B is further condensed in the solid state to give a polymer having a viscosity number of greater than 140 ml/g.

5. A process as claimed in claim 1, wherein the difference between carboxyl end groups and amino end groups of the product B is selected so as to be in the range from 50 to −10 mmol/kg.

* * * * *